United States Patent [19]
Gough

[11] Patent Number: 5,202,750
[45] Date of Patent: Apr. 13, 1993

[54] MOS-GATED THYRISTOR

[75] Inventor: Paul A. Gough, Ifield, England

[73] Assignee: U.S. Philips Corp., New York, N.Y.

[21] Appl. No.: 894,166

[22] Filed: Jun. 3, 1992

Related U.S. Application Data

[63] Continuation of Ser. No. 664,172, Mar. 4, 1991, abandoned.

[30] Foreign Application Priority Data

Apr. 9, 1990 [GB] United Kingdom ............... 9008020

[51] Int. Cl.$^5$ .............. H01L 29/74; H01L 29/747; H01L 29/10; H01L 27/02
[52] U.S. Cl. .................... 257/133; 257/110; 257/155; 257/175
[58] Field of Search ............ 357/38, 38 S, 38 P, 357/38 T, 38 G, 38 C, 39, 23.4, 55, 46

[56] References Cited

U.S. PATENT DOCUMENTS 4,717,940 1/1988 Shinohe et al. ............... 357/38
5,034,785 7/1991 Blanchard ..................... 357/23.4

OTHER PUBLICATIONS

"Evolution of Mos-Bipolar Power Semiconductor Technology" Baliga; pp. 409-418; IEEE Proceedings vol. 76 No. 4, Apr. 1988.

Primary Examiner—Rolf Hille
Assistant Examiner—Wael Fahmy
Attorney, Agent, or Firm—Steven R. Biren

[57] ABSTRACT

A semiconductor device includes a thyristor (4,5,8,9) in which connection is made to the cathode region (9) of the thyristor by means of an MOS structure. The MOS structure is provided by a fifth region (11) forming a pn junction with the cathode region (9), a sixth region (13) in contact with the cathode electrode (C) and forming a pn junction (14) with the fifth region (11), and an insulated gate (15) overlying a conduction channel area (110) of the fifth region (11) for defining a gateable conductive path for charge carriers into the cathode region (9) to initiate thyristor action. The conductive path is thus controlled by the voltage applied to the insulated gate (15), enabling the flow of charge carriers to the cathode region (9) to be stemmed by application of an appropriate gate voltage oxide. The fifth region (11) is electrically connected to provide a path for extraction of charge carriers during turn-off of the thyristor, thereby improving the controllable current capability of the thyristor.

9 Claims, 2 Drawing Sheets

MOS-GATED THYRISTOR

This is a continuation of application Ser. No. 664,172, filed Mar. 4, 1991, now abandoned.

BACKGROUND OF THE INVENTION

This invention relates to a semiconductor device comprising a thyristor and especially, but not exclusively, to a semiconductor device comprising a so-called MOS-gated thyristor.

Semiconductor devices are known which comprise a semiconductor body having formed therein a thyristor having a first region of one conductivity type provided with a first main electrode, a second region of the opposite conductivity type forming a first pn junction with the first region, a third region of the one conductivity type forming a second pn junction with the second region and provided with a gate electrode, and a fourth region of the opposite conductivity type forming a third pn junction with the third region and having an electrical connection to a second main electrode.

In particular, semiconductor devices are known in which the gate electrode is in the form of an insulated gate overlying a conduction channel area of the third region for controlling a conductive path between the second region and the fourth region to enable the flow of charge carriers of the opposite conductivity type from the fourth region to the second region to trigger latching and so initiate thyristor action within the device. Such a MOS-gated thyristor is described at page 411 of a review entitled 'Evolution of MOS-bipolar Power Semiconductor Technology' by B. Jayant Baliga published in Proceedings of the IEEE Vol. 76, No. 4, Apr., 1988.

The aforementioned paper also describes at pages 415 to 416 a so-called MOS turn-off thyristor which differs from the simple MOS-gated thyristor in that it is capable of being both turned-on and turned-off by a signal applied to a MOS gate. The MOS turn-off thyristor consists of an insulated gate field effect transistor (MOST) integrated into the thyristor structure in such a manner that the emitter-base junction of the upper transistor can be short-circuited by the application of a gate voltage to the MOST. In the absence of the gate voltage, the device can be switched on either in the same manner as a conventional thyristor or by using a MOS gate in the same manner as for a MOS-gated thyristor. Thus, as shown in FIG. 15 of the aforementioned paper, the MOS turn-off thyristor has a fifth region of the one conductivity type formed within and shorted to the fourth region and the contiguous insulated gate overlies channel areas of the fourth and third regions. In order to achieve turn-off of the thyristor, the MOST defined between the fifth and third regions is turned-on by an appropriate voltage applied to the insulated gate so that charge carriers of the one conductivity type entering the third region have an alternate path to the second main electrode by-passing the pn junction between the fourth and third regions. However to achieve such forced turn-off, the resistance of the current path for the charge carriers of the one conductivity type must be so low that, when all such current is diverted via the MOST between the fifth and third regions, the forward biassing of the third pn junction is below 0.7 volts and so insufficient to maintain electron injection and transistor action. Although this condition may be quite readily achieved for relatively high current densities where the charge carriers of the one conductivity type are electrons, it is more of a problem where the charge carriers are less mobile holes.

SUMMARY OF THE INVENTION

It is an aim of the present invention to provide a semiconductor device comprising a thyristor in which the controllable current capability of the device is improved.

According to the present invention, there is provided a semiconductor device comprising a semiconductor body having formed therein a thyristor having a first region of one conductivity type provided with a first main electrode, a second region of the opposite conductivity type forming a first pn junction with the first region, a third region of the one conductivity type forming a second pn junction with the second region and provided with a gate electrode, and a fourth region of the opposite conductivity type forming a third pn junction with the third region and having an electrical connection to a second main electrode, characterized in that a fifth region of the one conductivity type forms a fourth pn junction with the fourth region, a sixth region of the opposite conductivity type in electrical connection with the second main electrode forms a fifth pn junction with the fifth region and an insulated gate overlies a conduction channel area of the fifth region for defining a conductive path for charge carriers of the opposite conductivity type into the fourth region for initiating thyristor action, the fifth region being electrically connected to provide a path for extraction of charge carriers of the one conductivity type during turn-off of the thyristor.

Thus, in a semiconductor device in accordance with the invention, electrical connection to the fourth region (the cathode in the case of an npnp thyristor) is provided by an integrated insulated gate field effect transistor (MOST) effectively in series with the fourth region which provides a gateable conductive path for the flow of charge carriers of the opposite conductivity type to the fourth region so enabling the flow of such charge carriers to be stemmed by application of an appropriate gate voltage during turn-off of the thyristor to improve the controllable current capability of the thyristor. In addition, the control over the flow of the charge carriers of the opposite conductivity type provided by the MOS in series with the fourth region should reduce turn-off times in comparison to the previously described MOS-controlled thyristors described above.

The gate electrode of the third region may comprise an insulated gate overlying a channel area of the third region. The insulated gate overlying the third region may be contiguous with the insulated gate overlying the fifth region which may simplify manufacture.

The contiguous insulated gates may be defined on the side walls of a groove extending into the semiconductor body. In particular, the groove may be in the form of a trench having its side walls covered by an insulating layer and being filled with electrically conductive material forming the gate electrode. The use of a groove or trench technology rather than a planar technology to form the insulated gates reduces the amount of surface area required and should provide better current handling capabilities.

In a modified embodiment of a device in accordance with the invention, in one or more areas of the semiconductor body, the third, fourth, fifth and sixth regions are replaced by a further region of the one conductivity with the insulated gate overlying a conduction channel area of the further region so that the further region defines with the first and second regions a three layer structure arranged in parallel with the structure defined by the first to sixth regions between the first and second main electrodes so that the further region provides a path for extraction of charge carriers of the one conductivity during turn-off of the thyristor. Such a structure enables an increase in the turn-off speed of the device and should, by diverting the current flow of the one conductivity type, also increase the maximum controllable current.

The first and second main electrodes may be provided on opposed surfaces of the semiconductor body so forming a vertical device, that is a device which the main current path is between the two opposed major surfaces of the semiconductor body.

The fifth region may be electrically connected to the second main electrode so as to form a three terminal device. Alternatively, a separate further electrode may be provided for the fifth region which, because of the independent control of the voltages applied to the second and further electrode, should further reduce the possibility of transistor action continuing during turn-off of the thyristor.

BRIEF DESCRIPTION OF THE DRAWING

Embodiments of the invention will now be described, by way of example, with reference to the accompanying drawing, in which.

It should be understood that the Figures are merely schematic and that, in particular, various dimensions such as the thicknesses of layers or regions may have been exaggerated in the interest of clarity.

DESCRIPTION OF THE PREFERRED EMBODIMENTS

Figure 1:
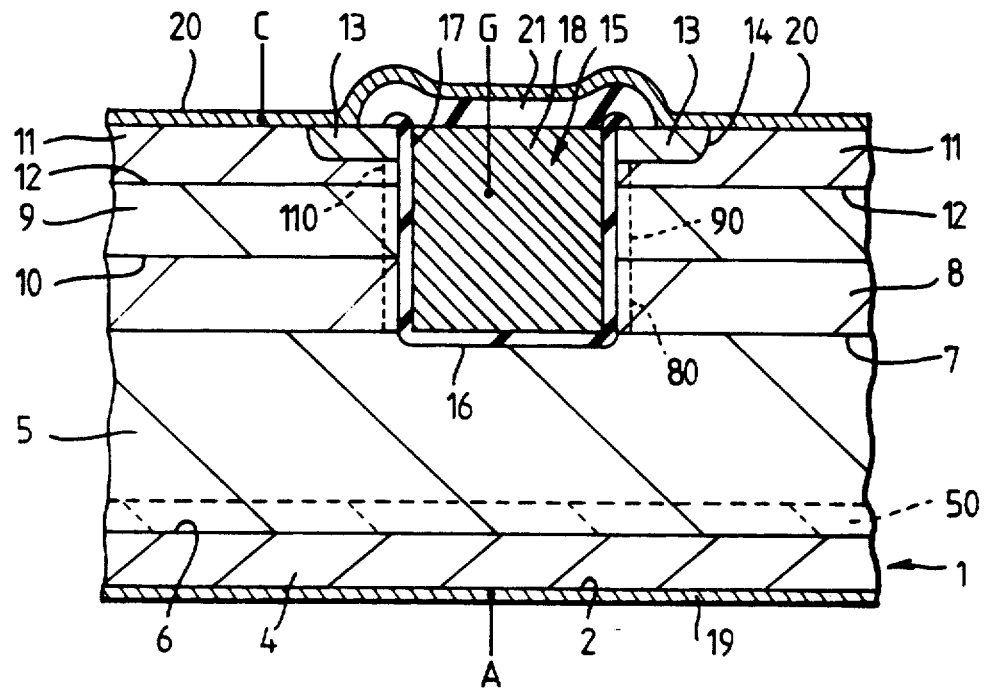
FIG. 1 is a schematic cross-sectional view of a first embodiment of a semiconductor device in accordance with the invention.

Referring now to the drawings, for example FIG. 1, there is illustrated a semiconductor device comprising a semiconductor body 1 having formed therein a thyristor having a first region 4 of one conductivity type provided with a first main electrode A, a second region 5 of the opposite conductivity type forming a first pn junction 6 with the first region 4, a third region 8 of the one conductivity type forming a second pn junction 7 with the second region 5, and provided with a gate electrode G, and a fourth region 9 of the opposite conductivity type forming a third pn junction 10 with the third region 8 and having an electrical connection through an overlying region to a second main electrode C.

In accordance with the invention, a fifth region 11 of the one conductivity type forms a fourth pn junction 12 with the fourth region 9, a sixth region 13 of the opposite conductivity type in electrical connection with the second main electrode C forms a fifth pn junction 14 with the fifth region 11 and an insulated gate 15 overlies a conduction channel area 110 of the fifth region for defining a conductive path for charge carriers of the opposite conductivity type into the fourth region 9 for initiating thyristor action, the fifth region 11 being electrically connected to provide a path for extraction of charge carriers of the one conductivity type during turn-off of the thyristor.

Thus, in a semiconductor device in accordance with the invention, an insulated gate field effect transistor (MOST) provided by the fourth, fifth and sixth regions 9,11 and 13 and the insulated gate 15 is provided in series with the fourth region 9 of the thyristor to provide a gateable conductive path via the conduction channel area 110 for the flow of charge carriers of the opposite conductivity type to the fourth region 9 so enabling this flow to be stemmed by application of an appropriate gate voltage during turn-off of the thyristor to allow a greater controllable current capability and in addition to enable the turn-off time of the device to be reduced.

Referring now specifically to FIG. 1, there is illustrated an npnp thyristor having a MOS-gated cathode in accordance with the invention.

Thus in the example shown in FIG. 1, the first or anode region 4 is provided as a monocrystalline silicon substrate doped with impurities of the one conductivity type, in this example boron ions, to provide a resistance of typically 0.01 ohm cm. The second or n-base region 5 is then provided on the first region 4 as a relatively lowly doped epitaxial layer of silicon doped with impurities of the opposite conductivity type, in this case n conductivity type, for example arsenic ions, to a dopant concentration of typically $10^{14}$ atom cm$^{-3}$. If desired, a more highly n-conductivity type doped buffer layer 50 (shown in phantom lines in FIG. 1) may be provided between the first and second regions 4 and 5 to moderate the hole current from the relatively highly doped first or anode region 4. The dopant concentration and thickness of the epitaxial layer deposited to form the second region 5 will depend on the desired characteristics of the device but may typically be 100 μm (micrometers) for a 1000 volt device. The third region 8 may be provided as an epitaxial layer doped with impurities of the one conductivity type, p type in this example, or alternatively may be formed by implantation and/or diffusion of impurities into the second region 5.

The third region, in this example the p-base region 8, the fourth or cathode region 9, and the fifth region 11 may all be formed either by epitaxial growth of appropriately doped layers of silicon or by implantation and/or diffusion of the appropriate impurities into the second region 5. Typically, for a 1000 volt device, the p-base region may have a thickness of about 3 μm and a dopant concentration of about $10^{16}$ atoms cm$^{-3}$ while the cathode region 9 may have a thickness of about 1 μm and a dopant concentration of about $10^{16}$ atom cm$^{-3}$. The fifth region 11 may be about 2 μm thick and have a dopant concentration of about $3 \times 10^{16}$ atoms cm$^{-3}$.

In this example, the sixth region 13 is then formed as a planar region within the fifth region 11 by introducing impurities of the opposite conductivity type, n conductivity type in this example, through an appropriate mask (not shown) in conventional manner. Typically, the sixth region 13 may have a depth of about 0.5 to 1 μm.

The thyristor shown in FIG. 1 is a MOS-gated thyristor so that the gate electrode G of the third region 7 comprises an insulated gate and in the example being described this insulated gate is contiguous with the insulated gate 15 of the MOS-gated cathode.

In the example shown in FIG. 1, the insulated gate 15 is defined by first etching, using conventional techniques, a trench 16 through the sixth, fifth, fourth and third regions 13,11,9,7 and slightly into the second region 5. The depth of the trench should, as is known in the art, be carefully controlled so as to ensure that the trench 16 extends completely through the third region 8 but does not extend so far into the second region 5 as to adversely effect the desired breakdown voltage of the device. For the dimensions given above for the regions 8,9 and 11, the trench 16 will be about 6 $\mu$m deep. After usual cleaning procedures, a thin insulating layer 17 is thermally grown by conventional techniques on the side walls of the trench and with the mask used during definition of the trench still in place, electrically conductive material, in this example doped polycrystalline silicon, is deposited into the trench to form an electrically conductive plug 18 providing the gate electrode G of the third region 8 and also the insulated gate 15 overlying the conduction channel area 110 of the fifth region 11. A layer of insulating material, for example silicon dioxide, is then deposited and patterned using conventional photolithographic and etching techniques to define a capping oxide layer 21 covering the electrically conductive plug 18.

Conventional metallization 19,20, for example aluminum, is then deposited onto the opposed upper and lower surfaces of the semiconductor body 1 to define the first (anode) upper and second (cathode) lower electrodes A and C. Although not shown in FIG. 1, contact is made to the gate G at the periphery of the device 1.

Thus, in the example shown in FIG. 1, the fifth region 11 is shorted via the cathode metallization 10 to the second (cathode) main electrode C.

Generally, the device will have a cellular structure with the trench 16 forming, when viewed in plan (that is looking down onto the surface of the fifth region 11), a grid or mesh structure. Thus, for example, the trench 16 may form a rectangular grid pattern or possibly a hexagonal grid pattern. FIG. 1 thus shows a cross-section through one strip-like section of the grid - like trench 16.

In operation of the thyristor shown in FIG. 1, the device is turned on by applying an appropriate positive gate voltage +Ve to the gate electrode G. The positive gate voltage induces an n conductivity type inversion channel in the conduction channel areas 110 and 80 along the edge of the trench 16, allowing the flow of electrons into the second region 5 and thus causing the first pn junction 6 to become forward-biassed. This forward-biassing of the first pn junction 6 causes holes to be injected into the second region 5 which flow into the third regions 8 to form, effectively, a base current for the npn transistor formed by the second, third and fourth regions 5,8,9. The turning on of this transistor initiates triggering or latching of the thyristor so that the device is now switched on.

Once in the latched state, the thyristor may be turned off by applying a negative gate voltage −Ve to the gate electrode G, causing a p conductivity type inversion channel to be formed in a conduction channel area 90 of the fourth region 9 adjacent the trench 16. This has the effect of preventing or at least inhibiting the flow of electrons from the sixth region 13 to the fourth (cathode) region 9 thus starving the thyristor of electrons and so initiating turn-off of the thyristor. In addition, the p conductivity channel thus formed in the conduction channel area 90 of the fourth (cathode) region 9 between the third and fifth region 8 and 11 provides a conductive path for the extraction of holes via the cathode metallization 20 to which the fifth region 11 is shorted.

The lateral extent of the sixth region 13 can be made very small so that the path for holes beneath the sixth region to the cathode metallization and so the possibility of the pn junction 14 becoming sufficiently forward biassed to initiate transistor action is insignificant. The sixth region 13 could be formed as several discrete subsidiary region so that when viewed in plan, that is looking down on the major top surface, the sixth region is formed by separate islands or fingers spaced along and adjoining the edges of the trench. Although it has been assumed above that the gate electrode G is continuous, where as described above the device has a cellular structure, the cells at the periphery of the device may have a gate electrode contact which is separate from that of the central cells which may enable better control of the turn off of the device by allowing the turn-off of the central cells to be controlled independently of the peripheral cells.

Figure 2:
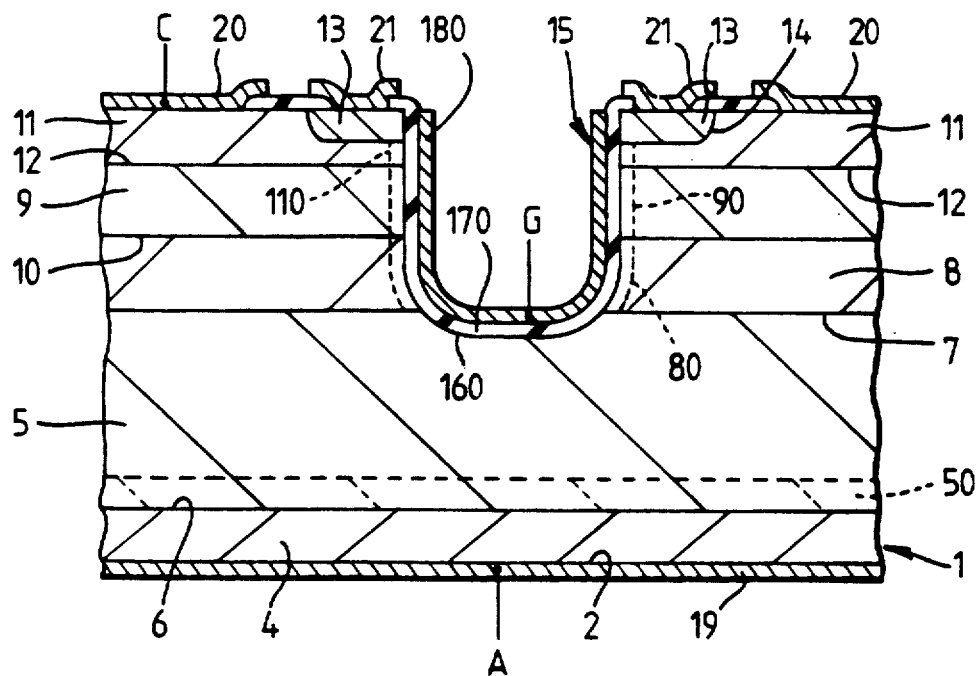
FIG. 2 is a schematic cross-sectional view of a second embodiment of a semiconductor device in accordance with the invention.

FIG. 2 is a cross-sectional similar to FIG. 1 of a second embodiment of a device in accordance with the invention. The device shown in FIG. 2 differs from that shown in FIG. 1 in that a VMOS type MOS gate 160,170,180 rather than a trenchfet type MOS gate is provided and in that a separate electrical contact 21 is provided for the fifth region 11 by definition in a conventional manner of an insulating region 22 of, for example silicon dioxide, on the major surface 3 and by appropriate conventional patterning of the subsequently deposited cathode metallization 20. This has the advantage that the fifth region can, at the expense of having four terminals, be biassed independently of the sixth region 13 and so further assists in avoiding the possibility of the pn junction 14 becoming sufficiently forward-biassed to initiate transistor action when attempting to turn-off the device. In all other respects the thyristor shown in FIG. 2 operates in the same manner as that shown in FIG. 1 although of course holes extracted during turn-off are extracted via the further electrode provided by the metallization 21 rather than via the cathode C metallization 20. Of course the device shown in FIG. 1 may similarly be provided with a separate electrical contact for the fifth region by appropriate patterning of the cathode metallization 20. The device shown in FIG. 2 may be manufactured using conventional VMOS technology and may have a cellular structure similar to that of the device shown in FIG. 1.

Figure 3:
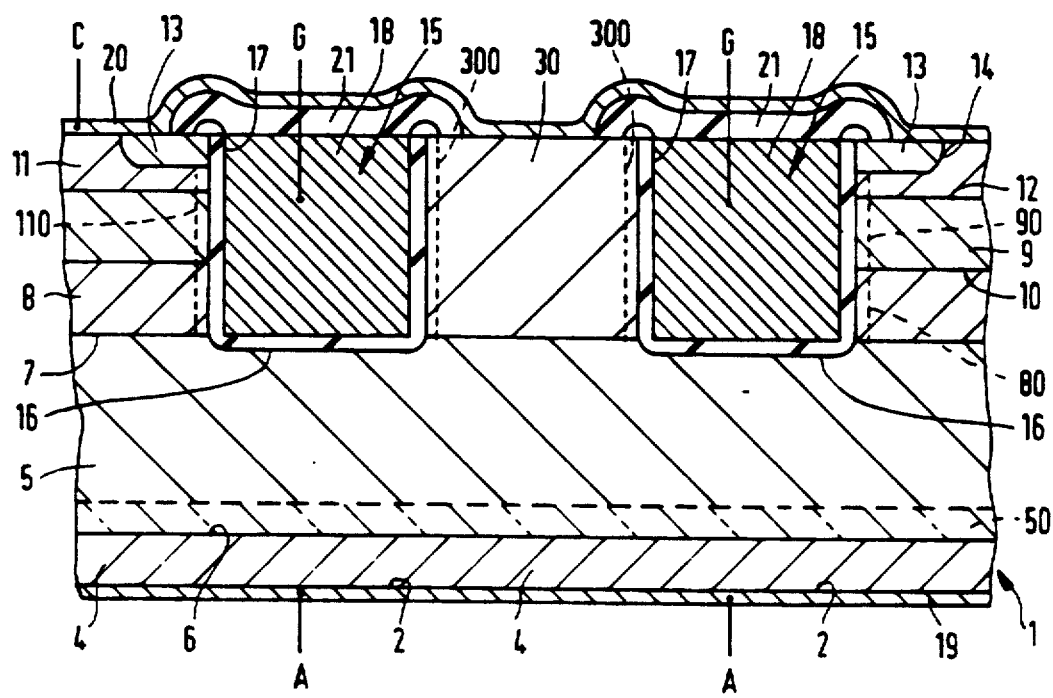
FIG. 3 is a schematic cross-sectional view of a modified embodiment of a semiconductor device in accordance with the invention.

FIG. 3 illustrates a modified version of a device in accordance with the invention. As mentioned above, generally a device in accordance with the invention may have a cellular structure with an array or pattern of sixth region 13 and a grid-like, when viewed looking down on the surface, insulated gate 15 to define a number of parallel-connected MOSTs provided by the fourth, fifth and sixth regions 9,11 and 13 and the insulated gate 15.

In the example shown in FIG. 3, an area 30 of the semiconductor body 1 bounded by the trench or groove 16 of the insulated gate structure is in the form of a region of the one conductivity type, p conductivity type in this example, which extends from the second region 5 to the surface at which the metallization 20 is provided to define the cathode contact C. Thus, in the region of the area 30 the device defines a three layer, pnp in this example, structure.

A number of these regions 30 or cells of the one conductivity type may be provided in the cellular structure of the device, for example alternate cells may be formed using the regions 30, by diffusion of an appropriate dopant, such as boron in this example, through a suitable mask after completion of any epitaxial growth of layers.

The device shown in FIG. 3 operates in a similar manner to those shown in FIGS. 1 and 2 except that during turn-on with an appropriate positive gate voltage +Ve applied to the gate electrode G, in addition to the n conductivity inversion channels in the conduction channel areas 110 and 80, an n conductivity inversion channel is induced in a conduction channel area 300 defined by the region 30 adjacent the insulated gate 15.

During turn-off of the device shown in FIG. 3, in addition to the p conductivity type inversion channel formed in the conduction channel area 90 inhibiting the flow of electrons, the p conductivity type region 30 provides a path to allow holes to be extracted from the device. The structure shown in FIG. 3 enables an increase in the speed of turn-off and by diverting the hole current flow should also increase the maximum controllable current. The provision of the p conductivity type region 30 will increase the on-resistance of the device. However, it should be possible to optimize the device structure for the desired operating characteristics by adjusting the ratio of p conductivity type cell or regions 30 to MOST cells 9,11,13 and so adjusting the trade-off between turn-off speed and on-resistance.

Although in the examples described above the device is a vertical device, that is a device with the main current path between the two opposed major surfaces of the semiconductor body 1, this need not necessarily be the case and the present invention may be applied to lateral devices, that is devices with current flow in a direction along the major surfaces. In addition, although the devices described use a grooved technology to define the insulated gate structure, it may be possible, with appropriate geometry adjustment, to apply the present invention to a planar technology where the insulated gate 15 is formed on the top major surface and the regions 8,9 and 11 are like the region 13 formed as planar regions by introducing, using appropriate maskings, impurities into the surface of the second region 5. With such a planar geometry, the channel length at the surface of the device would necessarily be rather long.

Moreover, although the insulated gates G, 15 are described above as being contiguous or integral, they may be discrete and may be separately operable. For example, the gates G, 15 may be formed by having separate grooves for the insulated gate G and for the insulated gate 15 or by appropriate patterning where a planar technology is used.

It will of course be appreciated that the semiconductor conductivity types given above can be reversed to form a pnpn thyristor and that the present invention may be applied to semiconductor materials other than silicon, for example germanium or III-V materials such as gallium arsenide or to devices involving heterojunction structures. Thus, for example, the sixth region 13 could be formed by depositing a wider bandgap material such as silicon carbide where the device is a silicon device on the fifth region 11 and then, using appropriate masking and etching technology, defining the sixth region 13 as a mesa structure on the fifth region 11.

From reading the present disclosure, other modifications or variations will be apparent to persons skilled in the art. Such modifications or variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

I claim:

1. A semiconductor device comprising a semiconductor body having formed therein a thyristor having first and second main electrodes and a gate electrode and having a first region of one conductivity type provided with the first main electrode, a second region of the opposite conductivity type forming a first pn junction with the first region, a third region of the one conductivity type forming a second pn junction with the second region and provided with the gate electrode, and a fourth region of the opposite conductivity type forming a third pn junction with the third region, characterized in that a fifth region of the one conductivity type forms with a fourth region a fourth pn junction separating the fourth region from the second main electrode, a sixth region of the opposite conductivity type is electrically connected to the second main electrode and forms a fifth pn junction with the fifth region, and an insulated gate overlies a conduction channel area of the fifth region for defining a gateable conductive path from the second main electrode and into the fourth region for charge carriers of the opposite conductivity type for initiating thyristor action, and in that an electrical connection is made to the fifth region to provide a path for extraction of charge carriers of the one conductivity type during turn-off of the thyristor.

2. A semiconductor according to claim 1, further characterized in that the gate electrode of the third region comprises an insulated gate overlying a channel area of the third region.

3. A semiconductor device according to claim 2, further characterized in that the insulated gate overlying the third region is contiguous with the insulated gate overlying the fifth region.

4. A semiconductor device according to claim 3, further characterized in that the contiguous insulated gates are defined on the side walls of a groove extending into the semiconductor body.

5. A semiconductor device according to claim 4, further characterized in that the groove is in the form of a trench having its side walls covered by an insulating layer and being filled with electrically conductive material forming the gate electrode.

6. A semiconductor device according to claim 1, further characterized in that, in at least one area of the semiconductor body, the third, fourth, fifth and sixth regions are replaced by a further region of the one conductivity with the insulated gate overlying a conduction channel area of the further region so that the further region defines with the first and second regions a three-layer structure arranged in parallel with the structure defined by the first to sixth regions between the first and second main electrodes such that the further region provides a path for extraction of charge carriers of the one conductivity during turn off of the thyristor.

7. A semiconductor device according to claim 1, further characterized in that the first main electrode is provided on one main surface of the semiconductor body and the second main electrode is provided on the other, opposed main surface of the semiconductor body.

8. A semiconductor device according to claim 1, further characterized in that the fifth region is electrically connected to the second main electrode.

9. A semiconductor device according to claim 1, further characterized in that the fifth region is connected to a further, separate electrode.

* * * * *